United States Patent [19]
Gonzalez

[11] Patent Number: 5,234,856
[45] Date of Patent: Aug. 10, 1993

[54] DYNAMIC RANDOM ACCESS MEMORY CELL HAVING A STACKED-TRENCH CAPACITOR THAT IS RESISTANT TO ALPHA PARTICLE GENERATED SOFT ERRORS, AND METHOD OF MANUFACTURING SAME

[75] Inventor: Fernando Gonzalez, Boise, Id.
[73] Assignee: Micron Technology, Inc., Boise, Id.
[21] Appl. No.: 869,683
[22] Filed: Apr. 15, 1992
[51] Int. Cl.[5] .................... H01L 21/44; H01L 21/70
[52] U.S. Cl. ........................... 437/47; 437/52; 437/203; 437/919
[58] Field of Search ............... 437/47, 52, 60, 919, 437/228, 203; 385/149, 185; 257/301, 302, 303–316

[56] References Cited
U.S. PATENT DOCUMENTS 4,951,175  8/1990  Kurusawa et al. ............... 437/48
4,975,383 12/1990  Baglee ........................... 437/203
5,066,608 11/1991  Kim et al. ....................... 437/203

*Primary Examiner*—Olik Chaudhuri
*Assistant Examiner*—Loc Q. Trinh
*Attorney, Agent, or Firm*—Angus C. Fox, III

[57] ABSTRACT

A new stacked-trench DRAM cell has a trench that is self-aligned to an adjacent field oxide region and the dielectric spacer insulated edge of the access transistor gate. The trench is lined with dielectric material and an arsenic-doped polysilicon storage node plate makes contact with the storage node junction on a horizontal surface on the lip of the trench. The horizontal surface is exposed following trench formation by etching away an outer portion of the transistor gate spacer, which is comprised of a material that is selectively etchable with respect to an inner portion of the spacer. Since the contact area between the storage node plate and the storage node junction is limited to this very small area, the potential for leakage of capacitor charge into the substrate is minimized.

7 Claims, 5 Drawing Sheets

DYNAMIC RANDOM ACCESS MEMORY CELL HAVING A STACKED-TRENCH CAPACITOR THAT IS RESISTANT TO ALPHA PARTICLE GENERATED SOFT ERRORS, AND METHOD OF MANUFACTURING SAME

FIELD OF THE INVENTION

This invention relates to dynamic random access memory (DRAM) cells and, more particularly, to a method for manufacturing a DRAM cell having a capacitor which is constructed both in a trench adjacent the cell access transistor and on top of the cell access transistor in such a way so as to minimize the potential for alpha article generated soft errors, minimize charge leakage problems related to crystal defects in the trench, yet still make adequate contact between the bottom plate of the capacitor and the transistor's storage node junction.

BACKGROUND OF THE INVENTION

A DRAM memory cell comprises a storage capacitor and a field effect transistor, the channel of which couples a storage node junction (which is coupled to one plate of the capacitor) and an Access node junction (which is coupled to a bitline). In DRAM cells utilizing a conventional planar capacitor, far more chip surface area is dedicated to the planar capacitor than to the field-effect transistor (FET). Wordlines are generally etched from a first doped polycrystalline silicon (hereinafter, "polysilicon" or "poly") layer. A doped region of silicon substrate functions as the lower (storage-node) capacitor plate, while a second doped polysilicon layer generally functions as the upper capacitor plate (cell plate). Although planar capacitors have generally proven adequate for use in DRAM chips up to the one-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate. This phenomena will cause a charge stored within the affected cell capacitor to rapidly dissipate, resulting in a "soft" error. Secondly, the sense-amplifier differential signal is reduced. This aggravates noise sensitivity and makes it more difficult to design column sense-amplifiers having appropriate signal selectivity. Thirdly, as cell capacitor size is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

As a result of the problems associated with the use of planar capacitors for high-density DRAM memories, all manufacturers of 4-megabit DRAMs are utilizing cell designs based on non-planar capacitors. Two basic non-planar capacitor designs are currently in use: the trench capacitor, and the stacked capacitor. Both types of non-planar capacitors typically require a considerably greater number of masking, deposition and etching steps for their manufacture than does a planar capacitor.

In a trench capacitor, charge is stored primarily vertically, as opposed to horizontally as in a planar capacitor. Since trench capacitors are fabricated in trenches which are etched in the substrate, the early trench capacitors, like planar capacitors, were particularly susceptible to soft errors. In addition, there are several other problems inherent in the trench design. One problem is that of trench-to-trench charge leakage, caused by the parasitic transistor effect between adjacent trenches. Another problem is capacitor leakage related to defects in the substrate crystal structure induced, primarily, by the trench etch itself, stresses inherent in the bird's beak region (the field oxide edge), or by thermal cycling during processing. Another problem of trench capacitors is the ineffectiveness of "Hi-C" boron implants. If the trench walls are implanted with an angled implant, the implanted boron will diffuse into the channel and disrupt transistor function. Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Since both the lower and the upper plates of a typical stacked capacitor are formed from individual conductive layers, the stacked capacitor is generally much less susceptible to soft errors than either the planar or trench capacitors. By placing the wordline and, in some designs, also the digitline beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

Although the stacked cell capacitor has proven to be the most manufacturable design for the four-megabit generation, trenches are generally considered to be a good bet for future generations, due to the fact that trenches can be made deeper for increased capacitance, without affecting topography of the array. However, the continuing development of new technology makes it impossible to reliably predict the design of future DRAM generations. For example, the problems of crystal defect-related capacitor leakage and high soft error rate, which were characteristic of early trench designs has been solved by lining the trenches with a dielectric material and using a deposited conductive layer for the storage-node plate. This technique also eliminates the need for a Hi-C boron implant. Nevertheless, advances in stacked capacitor technology promise to make that design a participant in the 64-megabit generation. For example, complex three-dimensional structures have been created that greatly increase storage-node plate surface area. Generally, however, such structures require complex processing and multiple photomasks.

The electrodes, or plates, of a stacked capacitor are typically patterned from individual layers of conductively-doped polycrystalline silicon (hereinafter also "polysilicon"). One problem related to the use of a conductively-doped polysilicon layer for the bottom plate of a DRAM capacitor is that, unless the storage-node plate contact with the substrate is made a considerable distance from the cell access transistor, the dopant impurities from the polysilicon storage-node plate will tend to diffuse into the channel of the cell access transistor, resulting in lowered threshold voltages and high leakage current through the transistor when the gate is not activated.

A new capacitor design, which incorporates aspects of both the stacked and trench designs in order to further increase capacitor plate area, has recently been receiving considerable attention in the DRAM industry. Like the stacked capacitor, the new capacitor utilizes deposited conductive layers for both capacitor plates. However, in the stacked-trench capacitor, the storage-node plate lines a trench in the substrate in addition to covering the wordline. The stacked trench capacitor has an advantage of allowing increased capacitance for a given level of integration over either a simple stack or trench capacitors.

The most space-efficient way of making a stacked-trench capacitor is to etch the trench so that it is self-aligned both to an adjacent field oxide region and to the vertical edge of the access transistor gate spacer. There are several problems associated with self-aligned trenches. If the capacitor has a phosphorus-doped polycrystalline silicon storage-node capacitor plate, such a structure is particularly susceptible to the outdiffusion of phosphorus from the storage-node plate into the channel region of the adjacent access transistor, resulting in lowered access transistor threshold voltages and high leakage current. In-situ, arsenic doping of the capacitors polysilicon storage node plate (the plate which is in intimate contact with the access transistor's storage node junction) greatly mitigates the outdiffusion problem. Another problem is the difficulty of making contact between the capacitor's storage node plate if the trench is lined with a dielectric material in order to insulate the storage node plate from the substrate, and thus minimize the area exposed to alpha particle radiation hits.

SUMMARY OF THE INVENTION

A new stacked trench DRAM cell and a method for its fabrication is disclosed. The cell has a trench that is self-aligned to an adjacent field oxide region and the dielectric spacer insulated edge of the access transistor gate. The trench is lined with dielectric material and an arsenic-doped polysilicon storage node plate makes contact with the storage node junction on a horizontal surface on the lip of the trench. The horizontal surface is exposed following trench formation by etching away an outer portion of the transistor gate spacer, which is comprised of a material that is selectively etchable with respect to an inner portion of the spacer. Since the contact area between the storage node plate and the storage node junction is limited to this very small area, the potential for leakage of capacitor charge into the substrate is minimized.

DETAILED DESCRIPTION OF THE PREFERRED EMBODIMENT

Figure 1:
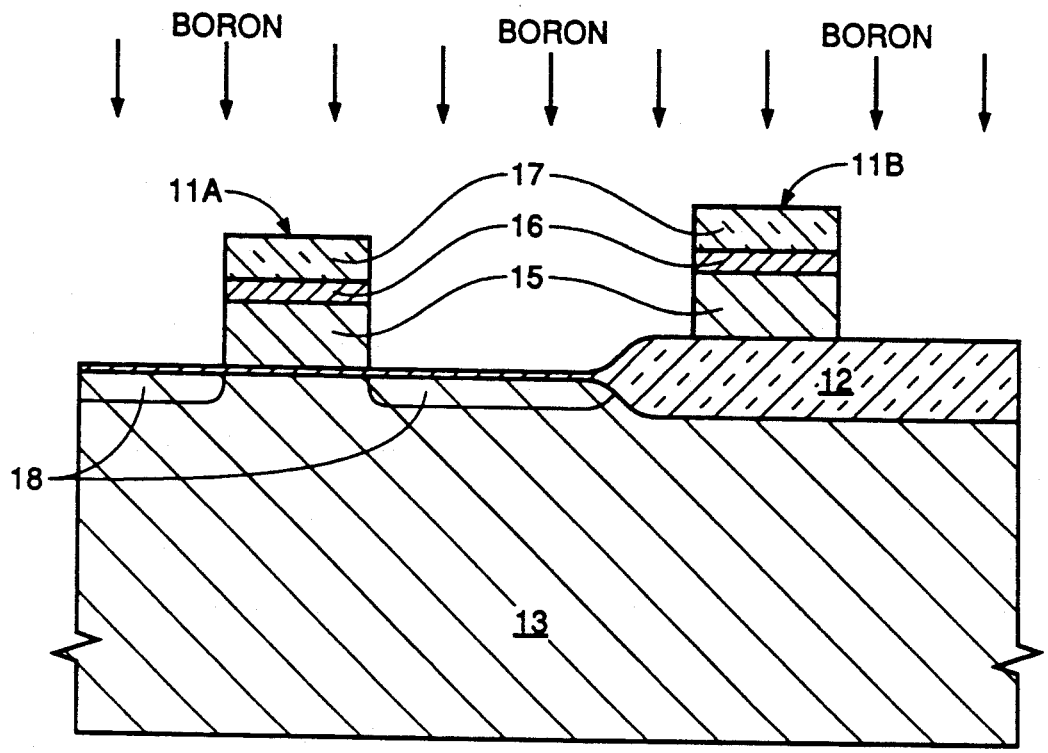
FIG. 1 is a cross-sectional view of an in-process DRAM array at a manufacturing stage where active areas and field oxide regions have been created, wordlines have been patterned from a silicon dioxide coated, silicided polysilicon-1 layer, and a boron punchthrough region has been implanted aligned to the vertical edges of the wordlines.

Referring now to FIG. 1, a small portion of an in-process dynamic random access memory (DRAM) array which will completed by fabricating cell capacitors of stacked trench design, is depicted at the beginning of the cell capacitor fabrication stage. Although only a single cell is depicted in the drawings, it is important to remember that many memory arrays (chips) are processed simultaneously on a single silicon wafer, and that each array can contain millions of individual memory cells. All memory cells on the wafer are processed identically.

Still referring to FIG. 1, a pair of wordlines IIA and IIB are depicted in this cross-sectional view. In the portion of the array that is depicted, wordline IIB is traversing a field oxide region 12 that was created using one of many local oxidation of silicon (LOCOS) processes that are well known in the art of semiconductor memory manufacture. Wordline IIA, on the other hand, is traversing an active area of substrate 13. Each wordline 14 has been patterned from a triple layer sandwich, consisting of a doped polysilicon layer 15, a refractory metal silicide layer 16, which lowers wordline resistance, and a silicon dioxide isolation layer 17, which is selectively etchable with respect to the substrate 13. At this stage in wafer processing, an anti-punchthrough region 18 has been created with an unmasked vertical boron implant, with the implanted boron atoms being aligned to the vertical edges of the wordline IIA.

Figure 2:
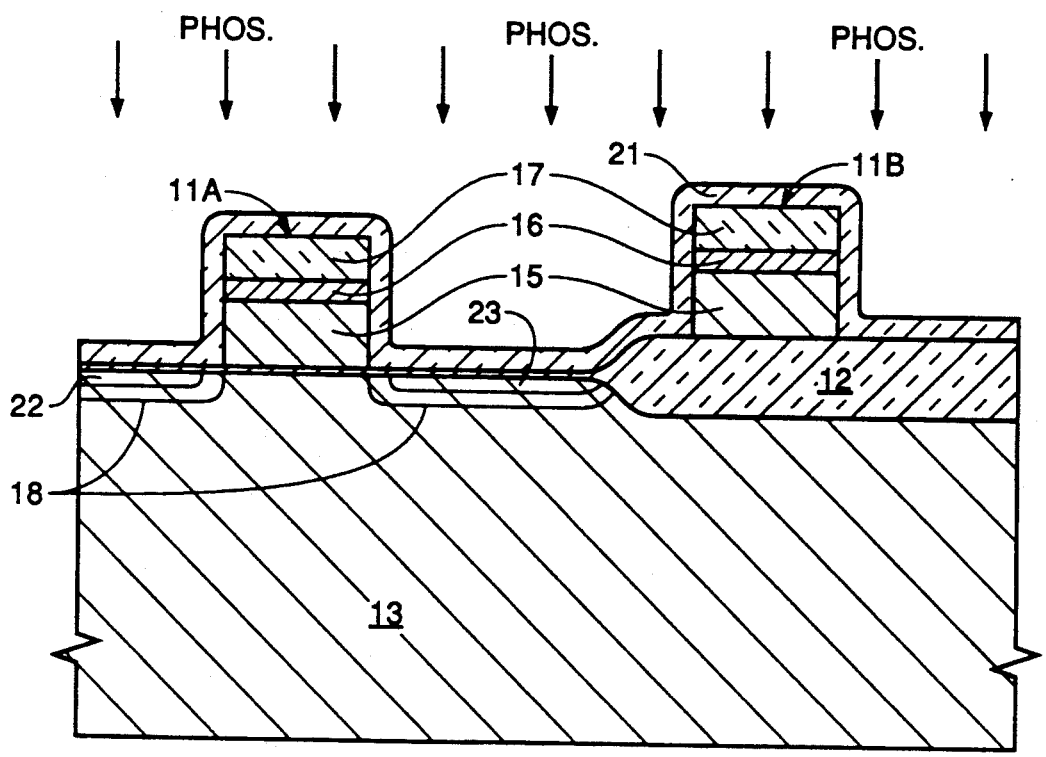
FIG. 2 is a cross-sectional view of the in-process DRAM array of FIG. 1 following the deposition of a conformal silicon dioxide spacer layer, and the creation of lightly-doped junction regions with a phosphorus implant aligned to the vertical portions of the silicon dioxide spacer layer.

Referring now to FIG. 2, following the deposition of a conformal silicon dioxide (oxide) spacer layer 21 over the array surface, a lightly-doped source/drain implant is performed with phosphorus in access-node junction regions 22 and storage-node junction regions 23, with the implanted phosphorus atoms aligned to the vertical portions of oxide spacer layer 21.

Figure 3:
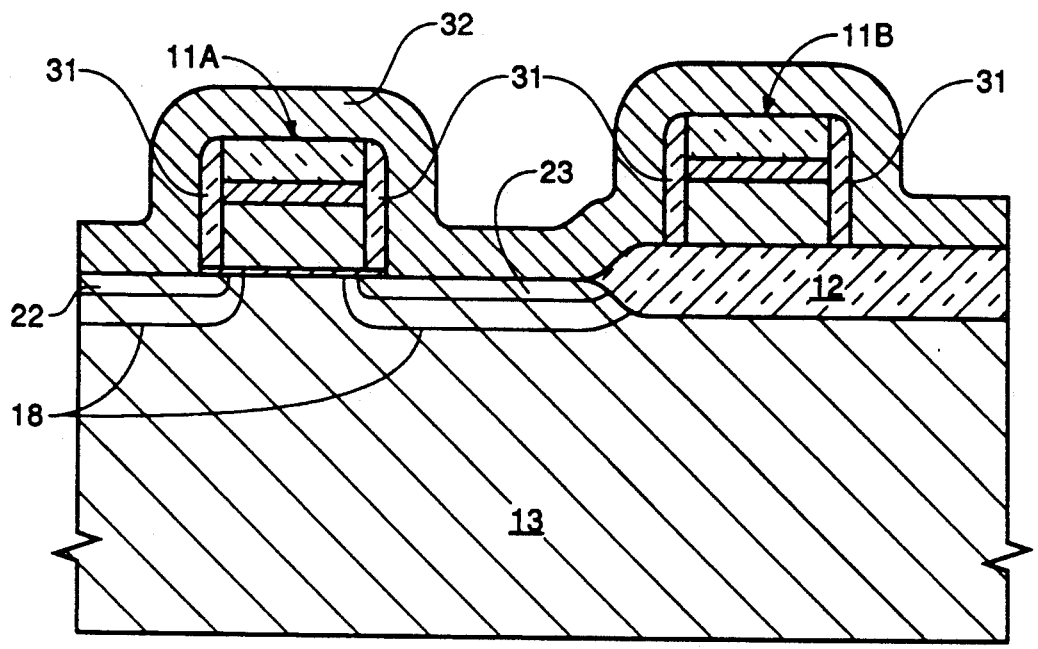
FIG. 3 is a cross-sectional view of the in-process DRAM array of FIG. 2 following an anisotropic etch of the silicon dioxide spacer layer which creates oxide spacers on the vertical edges of the wordlines, an elevated temperature step drive step, and deposition of a silicon nitride spacer layer.

Referring now to FIG. 3, an anisotropic reactive ion etch of oxide spacer layer 21 has created oxide spacers 31 on the vertical edges of wordlines 11. An elevated temperature step is then employed to drive the implanted boron and phosphorus atoms into the substrate and under the edges of wordlines 11. A conformal silicon nitride spacer layer 32 having a thickness of from 0.1–0.15 μm is then deposited over the surface of the wafer.

Figure 4:
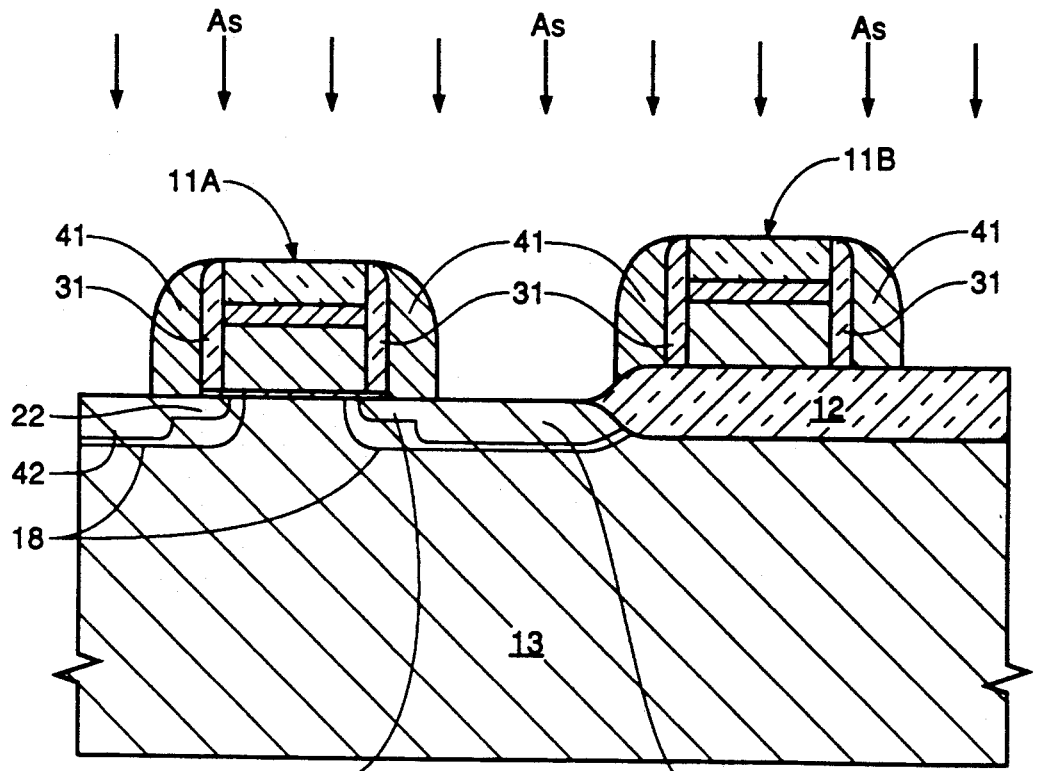
FIG. 4 is a cross-sectional view of the in-process DRAM array of FIG. 3 following an anisotropic etch of the silicon nitride spacer layer which creates nitride spacers adjacent the oxide spacers, and creation of heavily-doped junction regions with an arsenic implant aligned to the vertical edges of the nitride spacers.

Referring now to FIG. 4, an anisotropic reactive ion etch of silicon nitride spacer layer 32 has created nitride spacers 41A and 41B adjacent oxide spacers 31. Nitride spacers 41A are those which are adjacent the storage-node junction region 23. A heavily-doped source/drain implant is then performed with arsenic in access-node junction regions 22 and storage node junction regions 23, with the implanted arsenic atoms aligned to the vertical edges of nitride spacers 41.

Figure 5:
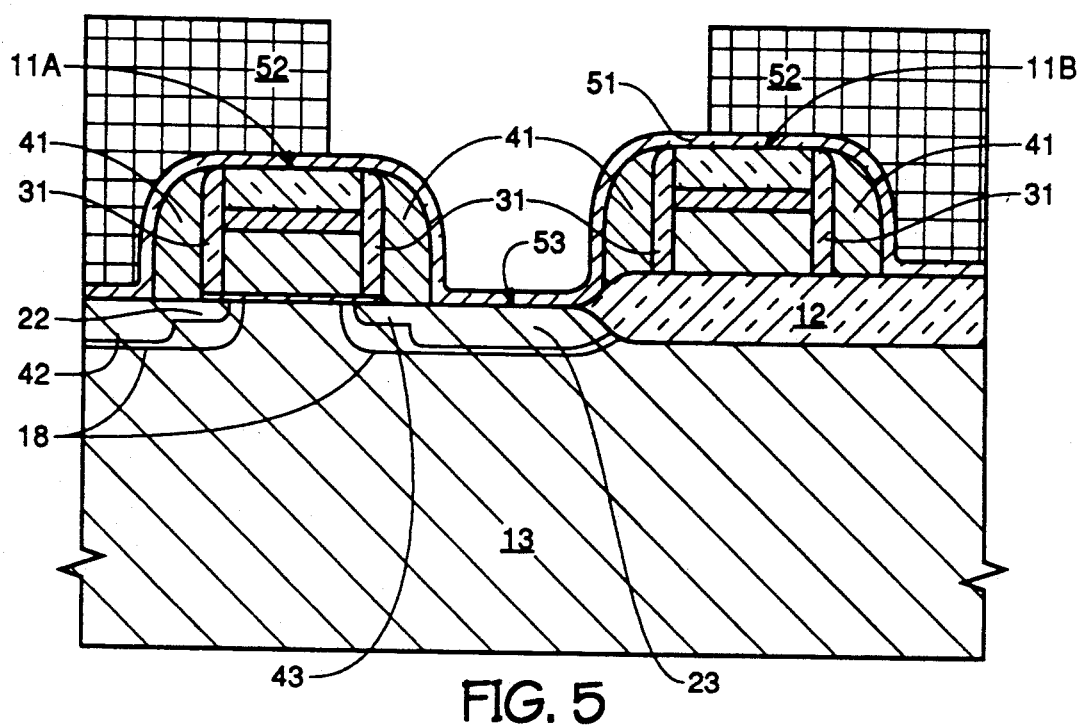
FIG. 5 is a cross-sectional view of the in-process DRAM array of FIG. 4 following the deposition of a conformal silicon dioxide etch stop layer and masking the array with photoresist so as to expose storage-node contact regions.

Referring now to FIG. 5, a conformal silicon dioxide etch stop layer 51 has been deposited over the surface of the array. The array is then masked with a storage-node contact photoresist mask 52, which exposes storage-node junction regions 23. The array is then subjected to a wet oxide etch which removes those portions of etch stop layer 51 that are within storage node junction regions 23.

Figure 6:
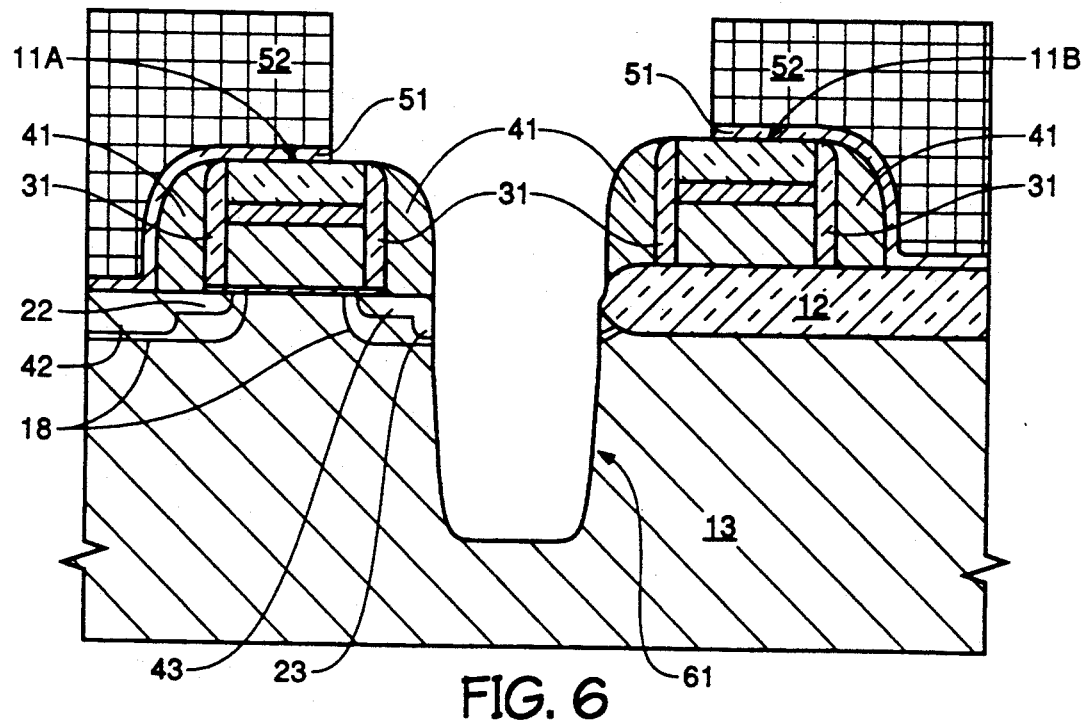
FIG. 6 is a cross-sectional view of the in-process DRAM array of FIG. 5 following a wet oxide etch and a subsequent anisotropic trench etch self aligned to the edges of the nitride wordline spacers that border the storage-node contact regions.

Referring now to FIG. 6, an anisotropic reactive ion etch, selective for silicon over silicon nitride and silicon dioxide, and self-aligned to the edges of nitride spacers 41 that border the storage-node junction regions 23, has created a trench 61. For the sake of clarity, it should be explained that the term self-aligned means that the trench width is not determined by the mask opening position, but rather by the etch selectivity of the materials within the mask opening.

Figure 7:
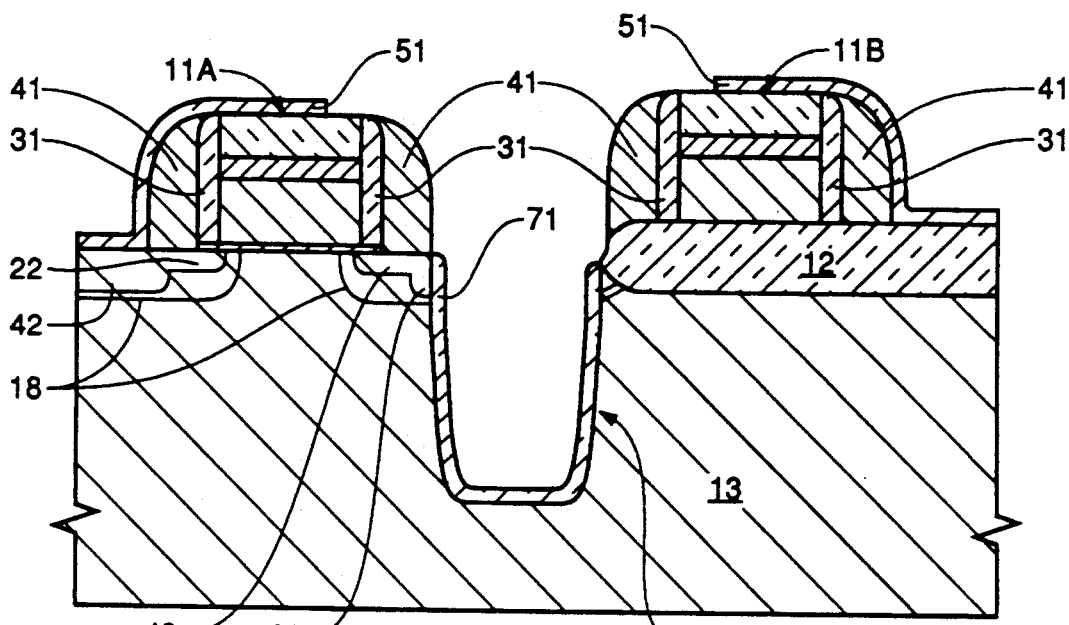
FIG. 7 is a cross-sectional view of the in-process DRAM array of FIG. 6 following removal of the storage-node contact photomask and subsequent oxidation of exposed substrate to create a silicon dioxide trench liner layer.

Referring now to FIG. 7, the storage-node contact photoresist mask 52 has been stripped, and an oxidation step of the exposed substrate has created a silicon dioxide trench liner layer 71 having a thickness of from 150–300 Å.

Figure 8:
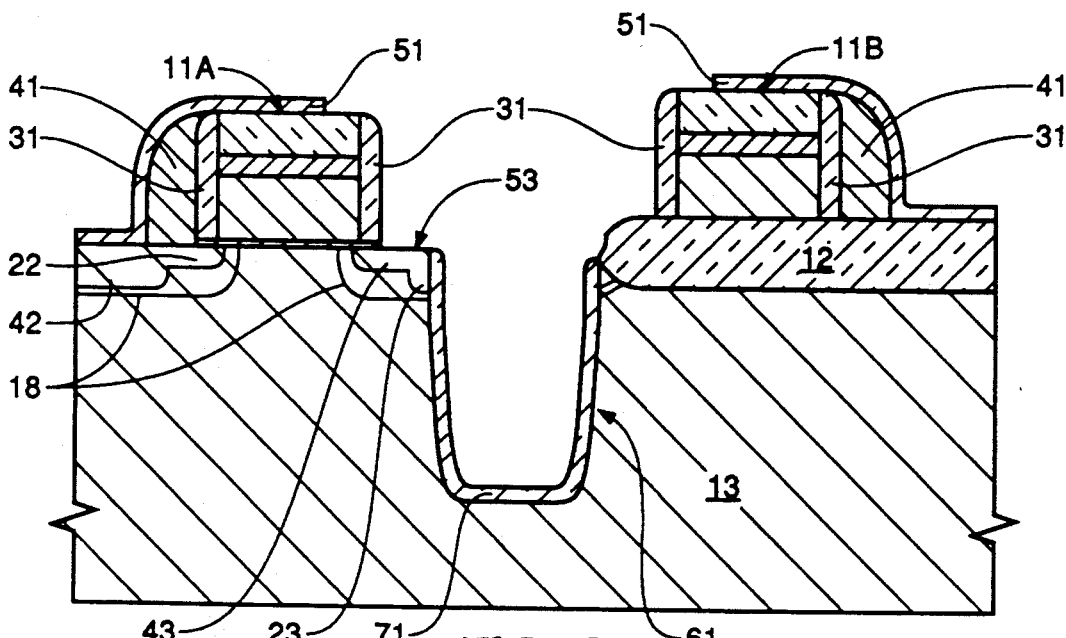
FIG. 8 is a cross-sectional view of the in-process DRAM array of FIG. 7 following removal of the nitride spacers in the storage node contact regions with a wet nitride etch.

Referring now to FIG. 8, the nitride spacers that border storage node junction regions 23 are stripped with a hot phosphoric acid etch, exposing a horizontal surface of each storage node junction within the array.

Figure 9:
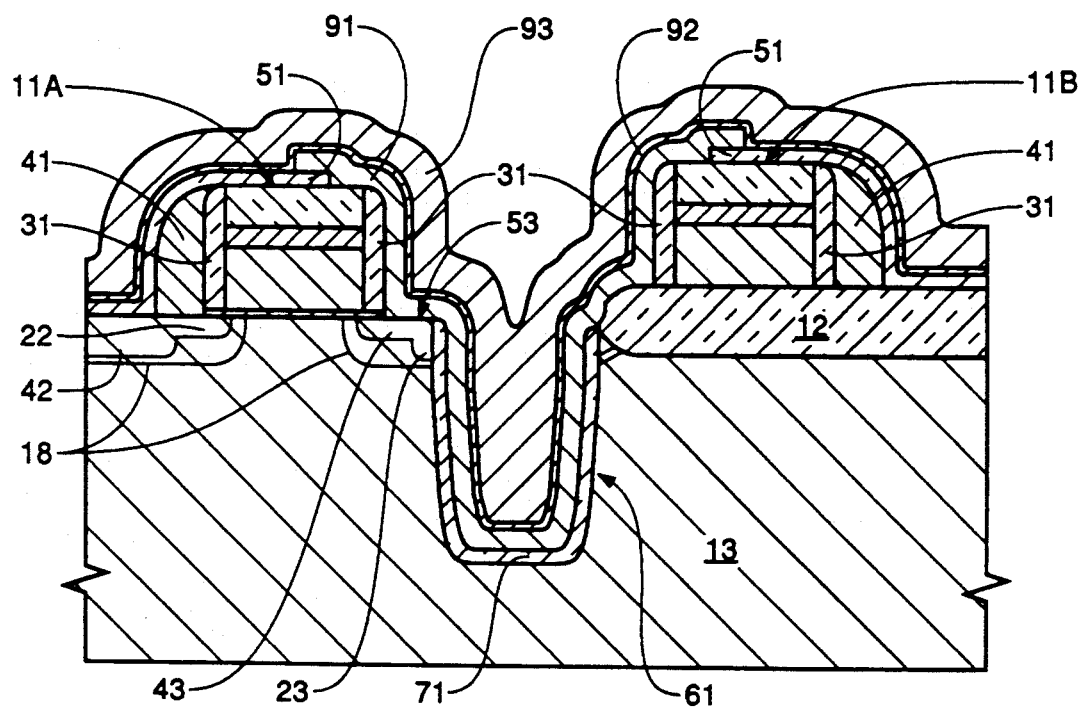
FIG. 9 is a cross-sectional view of the in-process DRAM array of FIG. 8 following deposition of a conformal storage-node plate layer, patterning of the storage-node plate layer, deposition of a capacitive dielectric layer and deposition of a cell plate layer.

Referring now to FIG. 9, the array is completed in a conventional manner. First, a conformal storage-node plate layer (generally polycrystalline silicon that is doped to render it conductive) is deposited over the surface of the entire array. Storage-node plate layer is then patterned with photoresist (not shown), and etched to create individual storage-node plates 91 (one for each DRAM cell). During the etch of the storage node plate layer to create individual storage-node plates 91, etch stop layer 51 protects the substrate in the access-node junction regions against the wet silicon etch used on the polycrystalline silicon storage-node plate layer. If another conductive material that can be selectively etched with regard to silicon is used for the storage node plate layer, silicon dioxide etch stop layer 51 is unnecessary.

A conformal capacitive dielectric layer 92 is then deposited. This is followed by the deposition of a cell plate layer 93. The cell capacitor is now completely formed. Bitline contact to the access node junction of each cell will be made during subsequent processing of the array. Another option is to remove the remaining nitride spacers following the creation of individual storage-node plates by, first, performing a wet oxide etch to remove etch stop layer 51, and then performing a hot phosphoric acid etch to remove remaining nitride spacers 41B.

Although only a single embodiment of the process for fabricating the improved stacked trench DRAM array has been disclosed herein, it will be obvious to those having ordinary skill in the art of semiconductor process technology that changes and modifications may be made thereto without departing from the spirit of the invention as claimed.

I claim:

1. A process for fabricating an array of stacked-trench DRAM cells on a silicon substrate, said substrate having been subjected to both implantation and LOCOS steps to create active areas and field oxide regions thereon, said process comprising the following sequence of steps:

(a) patterning wordlines from a first conductive layer overlaid with a layer of silicon dioxide;
   (b) subjecting the in-process array to an unmasked anti-punchthrough implant;
   (c) depositing a conformal silicon dioxide spacer layer over the incomplete array;
   (d) performing an unmasked, lightly-doped source/drain implant aligned to vertical portions of said silicon dioxide spacer layer;
   (e) depositing a conformal dielectric material external spacer layer over the incomplete array, said external spacer layer being selectively etchable with respect to silicon dioxide;
   (f) subjecting the in-process array to an anisotropic reactive ion etch in order to create external spacers from said external spacer layer, said external spacers being adjacent said vertical portions of said conformal silicon dioxide spacer layer;
   (g) performing an unmasked, heavily-doped source/drain implant aligned to the exposed vertical edges of said external spacers;
   (h) depositing a silicon dioxide etch stop layer;
   (i) masking the in-process array with photoresist so as to expose storage-node junction regions;
   (j) etching away portions of said etch stop layer that are within said storage-node junction regions;
   (k) performing an anisotropic reactive ion etch so as to create trenches in the substrate, each trench being self-aligned to the exposed vertical edges of external spacers on adjacent wordlines;
   (l) oxidizing exposed substrate regions in order to create a silicon dioxide liner layer within each trench;
   (m) performing a wet etch to remove external spacers which are adjacent each trench;
   (n) depositing a conformal storage-node plate layer;
   (o) creating individual storage-node plates from said conformal storage-node plate layer;
   (p) depositing a conformal capacitive dielectric layer; and
   (q) depositing a cell plate layer.

2. The process of claim 1, which further comprises the step of subjecting the in-process array to an anisotropic reactive ion etch to create spacers on the sidewalls of the wordlines from said vertical portions of said conformal silicon dioxide spacer layer, between steps (c) and (d).

3. The process of claim 1, which further comprises the step of subjecting the in-process array to an anisotropic reactive ion etch to create spacers on the sidewalls of the wordlines from said vertical portions of said conformal silicon dioxide spacer layer, between steps (d) and (e).

4. The process of claim 1, wherein said dielectric external spacer layer comprises silicon nitride.

5. The process of claim 4, wherein hot phosphoric acid is used to etch away the external spacers.

6. The process of claim 1, wherein the thickness of said external spacer layer is within a range of 0.1 to 0.15 $\mu m$.

7. The process of claim 1, wherein the thickness of said silicon dioxide liner layer is within a range of 150 to 300 Å.

* * * * *